United States Patent [19]

Pancholy et al.

[11] 4,170,666

[45] Oct. 9, 1979

[54] METHOD FOR REDUCING SURFACE RECOMBINATION VELOCITIES IN III-V COMPOUND SEMICONDUCTORS

[75] Inventors: Ranjeet K. Pancholy, Mission Viejo; Gordon J. Kuhlmann, Newport Beach; D. Howard Phillips, Orange, all of Calif.

[73] Assignee: Rockwell International Corporation, El Segundo, Calif.

[21] Appl. No.: 796,118

[22] Filed: May 11, 1977

[51] Int. Cl.$^2$ ............................................. B05D 5/12
[52] U.S. Cl. ..................................... 427/82; 148/6.3; 148/1.5; 357/52; 427/38; 427/85; 427/87
[58] Field of Search ....................... 357/52; 427/87, 82, 427/85, 38; 148/6.3, 1.5

[56] References Cited

PUBLICATIONS

Phillips et al., "Fabrication of GaAsP MIS Capacitors using a Thermal-Oxidation Dielectric Growth Process", J Electrochem. Soc, Aug. 1973.
Schwartz et al., "The Influence of Native Oxides on the Degradation and Passivation of GaAs Junction Layers", 1972 Symp. on GaAs (1972).
Kuhlmann et al., "The Effects of Ionizing Arsenide on Gallium Arsenide Phosphide MIS Structures", Univ. of New Mexico, Aug. 1973.
Coerver et al., "Thermal Oxidation of Gallium Aresnide Phosphide", Doctoral Thesis, Univ. of New Mexico, Aug. 1973.
Phillips et al., "Gallium-Arsenide-Phosphide MIS Capacitor Frabrication", Doctoral Thesis, Univ. of New Mexico, May 1972.

Primary Examiner—John D. Smith
Attorney, Agent, or Firm—H. Fredrick Hamann; G. Donald Weber, Jr.

[57] ABSTRACT

III-V compound semiconductors having native dielectrics thereon which are thermally grown from special composition surface layers thereof are provided with reduced surface recombination velocities by proper selection of the surface layer's composition and extent of conversion to the dielectric.

4 Claims, 3 Drawing Figures

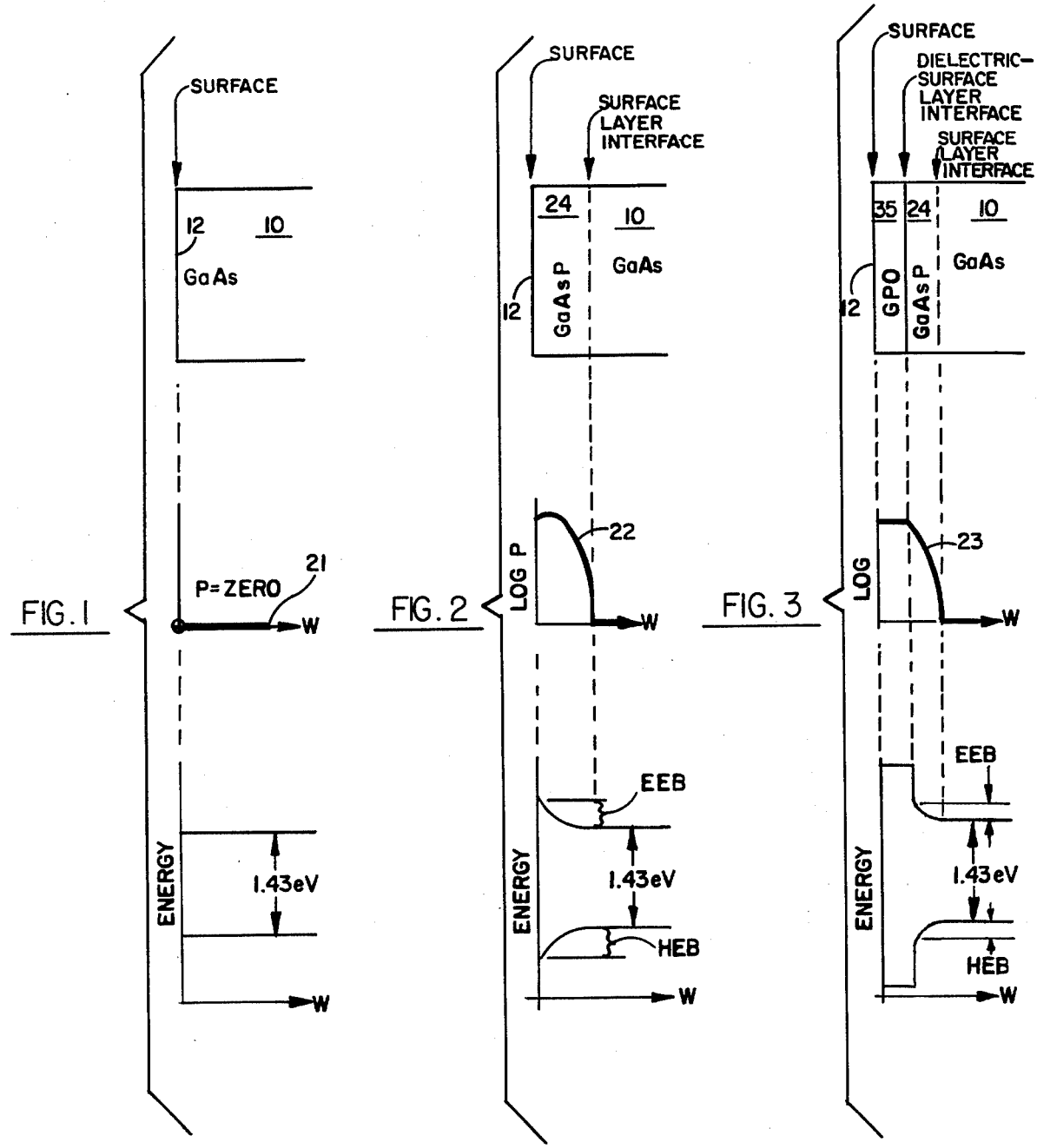

METHOD FOR REDUCING SURFACE RECOMBINATION VELOCITIES IN III-V COMPOUND SEMICONDUCTORS

RELATED APPLICATION

A related application entitled, "High Quality Passivation Dielectric and Method for III-V Compound Semiconductors" by Ranjeet K. Pancholy bearing Ser. No. 796,120 and filed on even day herewith contains related material and is incorporated herein by reference.

BACKGROUND OF THE INVENTION

1. Field of the Invention

The invention relates to the field of III-V semiconductor compounds and more particularly to means of reducing detrimental effects of carrier recombination at the semiconductor surface.

2. Prior Art

III-V compound semiconductor devices are well known in the art. The characteristics of many such devices suffer from the large surface recombination velocity of many III-V compounds. This large surface recombination velocity reduces the efficiency of devices constructed in III-V semiconductor materials because the high surface recombination velocity results in the annihilation of minority carriers which would otherwise constitute a portion of the useful output of the device. The prior art has attempted to overcome these problems by providing a passivation dielectric on the surface of the III-V compound which minimizes the surface recombination velocity. Such techniques have been partially successful in that they have reduced the surface recombination velocities to levels at which devices can function. However, for these devices to achieve their full potential, a further reduction in the surface recombination velocity is needed.

SUMMARY

The present invention reduces the effective surface recombination velocity by providing a native dielectric passivation layer on the semiconductor and by inducing a potential in the vicinity of the semiconductor-dielectric interface which repels or retards approaching minority carriers, thereby reducing the quantity of carriers available for recombination at that interface and thus the effective surface recombination velocity. This is accomplished by changing the chemical composition of the III-V semiconductor in the vicinity of the surface to allow the growth of the native passivating dielectric and controlling the depth to which that dielectric grows in order to leave a surface layer of the semiconductor which contains an added concentration of an energy band gap increasing element. The quantity of energy which must be possessed by a minority carrier in the main portion of the semiconductor in order for that carrier to reach the surface of the semiconductor is increased by the potential induced in the vicinity of the surface of the semiconductor by the increased energy band gap there.

BRIEF DESCRIPTION OF THE DRAWINGS

FIG. 1 illustrates the structure, energy band gap and added element concentration in a uniform III-V compound as a function of distance into the crystal.

FIG. 2 illustrates the structure, energy band gap and added element concentration in a III-V compound as a function of depth in the material where the surface of the material has been modified to have a larger energy band gap than the unmodified regions of a semiconductor.

FIG. 3 illustrates the structure, energy band gaps and added element concentration in a III-V compound semiconductor as a function of depth after the surface of the material has been converted to a native amorphous passivating layer in accordance with the teachings of the related Pancholy Application mentioned previously.

DESCRIPTION OF THE PREFERRED EMBODIMENT

In accordance with the teachings of the incorporated by reference Pancholy Application, a III-V semiconductor wafer is prepared for thermal conversion of the surface thereof to an amorphous, highly adherent passivating dielectric by the provision of a surface layer thereon which contains an increased concentration of a passivation enabling element whose presence makes possible the formation of a high quality amorphous passivation dielectric by thermal conversion of the surface. This element should be selected from Group III or Group V of the periodic table in order to maintain the monocrystalline nature of the semiconductor and its crystal structure. In accordance with the present invention, that nutrient is selected to be one whose presence will increase the energy band gap of the semiconductor material. Thereafter, the surface of the crystal is converted to a native dielectric in accordance with the teachings of the incorporated by reference Application However, in accordance with the present invention the conversion is not allowed to proceed to the full depth of the surface layer. As a result, the portion of the surface layer which is not converted to the dielectric retains a concentration of the band gap energy increasing nutrient. Accordingly, the band gap energy in that region of the semiconductor crystal is increased over the value for the unmodified region of the semiconductor. This creates a potential which retards the approach of minority carriers to the surface of the semiconductor crystal. This produces a reduction in the effective surface recombination velocity of the III-V compound semiconductor material because som carriers which would have otherwise reached the surface and recombined are repelled from the surface prior to arriving at the surface where they could have recombined.

A preferred embodiment in accordance with the invention comprises a gallium arsenide semiconductor crystal the surface of which is converted to gallium arsenide phosphide on which a gallium phosphate oxide (GPO) passivation dielectric is formed by consuming part of the thickness of the gallium arsenide phosphide. The unconverted portion of the gallium arsenide phosphide has a higher energy band gap than gallium arsenide does. This increases the energy which a minority carrier must possess in order to reach the interface between gallium arsenide phosphide and the GPO passivation dielectric. Consequently, the number of minority carriers reaching that interface is reduced below the number which would reach the gallium arsenide/GPO interface if the entire depth of the gallium arsenide phosphide were converted to passivation dielectric. The effective surface recombination velocity is a function of both the probability of a minority carrier located at the surface recombining and the probability of that minority carrier reaching the surface in the first place.

Since the probability of carriers reaching the surface is reduced, the effective surface recombination velocity of the structure in accordance with the present invention is reduced below its value in an otherwise identical gallium arsenide device in which the entire surface layer of the semiconductor is converted to the passivation dielectric. Which elements will increase the band gap energy of a III-V compound semiconductor depends in part on the composition of that semiconductor. However, those skilled in the art can readily determine which elements will increase the energy band gap if they know the composition of the basic semiconductor material.

A partial list of III-V semiconductors and the elements which on addition increase the band gap of the starting material is given in the following Table. A combination of elements can also be used.

TABLE

| Semiconductor | Added Element to Increase the Band Gap |
|---|---|
| GaAs | Phosphorous |
|  | Aluminum |
| GaSb | Arsenic |
|  | Phosphorous |
|  | Aluminum |
| InSb | Arsenic |
|  | Phosphorous |
| InAs | Phosphorous |

The steps involved in the fabrication of a device in accordance with the present invention are illustrated in the Figures, along with their effect on energy band gaps in the material. In the upper portion of FIG. 1 a gallium arsenide (GaAs) wafer 10 having a uniform composition as a function of depth is illustrated. The wafer has a processing surface 12. In order to increase the energy band gap in the vicinity of the surface of this material and to enable the passivating dielectric to be grown, phosphorous will be added to the surface of the material. In the middle portion of FIG. 1 the phosphorous concentration as a function of depth (w) is illustrated by curve 21. This concentration is zero for all depths at this time inasmuch as no phosphorous is present. In the lower portion of FIG. 1 the energy band gap between the valence and conduction bands of the gallium arsenide is illustrated as a function of depth into the crystal. Since the material 10 has uniform composition the energy band gap is constant throughout the material.

In FIG. 2, the wafer is illustrated after a surface layer 24 has been found which contains phosphorous and is gallium arsenide phosphide (GaAsP). The phosphorous necessary to form the gallium arsenide phosphide surface layer 24 on the gallium arsenide wafer 10 may be added in any appropriate manner. It is preferred to add the phosphorous by ion implantation followed by a high temperature (800° C.) anneal in a vacuum in order to remove crystal damage induced by the ion implantation and to assure that the GaAsP layer is essentially a monocrystalline continuation of GaAs 10. However, the surface layer may be formed by epitaxial growth, or other means if desired.

The concentration of the phosphorous as a function of depth into the wafer is illustrated by curve 22 in the middle portion of FIG. 2. It will be noted that the phosphorous concentration decreases as the interface between the gallium arsenide phosphide and the gallium arsenide is approached from the GaAsP side. The lower portion of FIG. 2 illustrates the energy band gap of the material as a function of depth. This figure also illustrates the potential barriers which must be overcome by electrons and holes in order to reach the surface of the material. These potential barriers may be referred to as the electron energy barrier (EEB) and the hole energy barrier (HEB) and are so designated on the figure.

In the upper portion of FIG. 3 the structure of the wafer is illustrated following the partial conversion of gallium arsenide phosphide 24 to a gallium phosphate/gallium oxide passivation layer 35 in accordance with the teachings of the related application. The middle portion of FIG. 3 illustrates by curve 23 the phosphorous concentration as a function of depth into the wafer. It will be noted that the phosphorous concentration decreases monotonically with increasing depth within the gallium arsenide phosphide layer. This aids in retarding minority carriers and therefore aids the improvement in surface recombination velocity. The lower portion of FIG. 3 illustrates the band gap energy in the wafer as a function of depth into the wafer. It will be noted, that in the passivation dielectric (GPO) the energy band gap is very large and the dielectric is a good insulator Within the gallium arsenide portion (GaAs) of the device the energy band gap is the uniform 1.43 eV characteristics of gallium arsenide. Within the gallium arsenide phosphide region of the device the energy band gap increases as the layer is traversed from the gallium arsenide to the passivation layer. The energy barriers EEB and HEB which must be overcome by electrons and holes respectively, in order to reach the semiconductor/passivation layer interface are illustrated. EEB and HEB are less than in FIG. 2 because of the phosphorous concentration at the GaAsP surface in FIG. 3 is less than that in FIG. 2.

It will be apparent from the above Figures that the energy barriers which must be surmounted by a minority carrier in order to reach the passivation layer/semiconductor interface are a function of the concentration of the phosphorous at that interface. In view of this, it might be thought that the higher the phosphorous concentration the better the device. However, increasing the phosphorous concentration in gallium arsenide reduces the electron mobility in the gallium arsenide. Consequently, a tradeoff is involved between reducing the surface recombination velocity by increasing the electron and hole energy barriers and the reduction in device performance which occurs with increased phosphorous concentration in the semiconductor material. The phosphorous concentration selected in making this tradeoff will depend on the particular device being fabricated and its intended purpose. In a device in which long minority carrier storage times are desired, a high phosphorous concentration will be selected in order to minimize the surface recombination of the minority carriers whereas in a device which is designed to operate at very high frequencies a substantially smaller phosphorous concentration will be selected in order to maintain the high mobility of electrons in the gallium arsenide.

While the preferred embodiment of the invention has been described in terms of utilizing the same nutrient as the passivation enabling nutrient and as the band gap increasing nutrient, it will be readily apparent to those of ordinary skill in the art that two different nutrients may be utilized. In that event, the nutrient which is used for band gap increasing should be introduced to a deeper depth in the semiconductor crystal than the nutrient which is utilized in order to enable passivation of the material in order that the passivation layer may be formed on the surface and the band gap increased layer may exist between the unmodified semiconductor and the passivation layer. The semiconductor indium arsenide (InAs) is a good example of this. Phosphorous increases the energy band gap of InAs and aluminum is an appropriate passivation enabling element.

The technique of this invention is also useful for reducing the energy band gap of the semiconductor at the surface for those devices whose operation requires a smaller energy gap at the surface. In those devices an element is selected which reduces rather than increases the band gap.

A method and structure for decreasing the effective surface recombination velocity in the III-V semiconductor compounds having native passivating dielectrics has been disclosed and described. Those of ordinary skill in the art will be able to modify the preferred embodiments which are illustrative rather than limited, without departing from scope of the invention which is limited only by the appended claims.

What is claimed is:

1. A method of making a semiconductor device wherein the surface recombination velocity is substantially reduced, comprising the steps of:

providing a wafer of semiconductor material having uniform composition, said wafer of semiconductor material is formed of a compound comprising III-V materials, forming a surface layer at one surface of said wafer by adding a nutrient element to change the chemical composition of said wafer in the vicinity of said one surface thereby to form an increased energy band gap adjacent said one surface of said wafer, said forming step is conducted by ion implantation such that said surface layer is formed as an integral part of said wafer, and converting only a portion of said surface layer to form a native passivation dielectric at said one surface of said wafer, said converting step is an oxidation process wherein only a portion of said surface layer is consumed during the converting step.

2. The method recited in claim 1 wherein said converting step comprises thermally converting said semiconductor material to said native dielectric at an elevated temperature in an atmosphere which supplies at least one, but not all of the elements which form said dielectric.

3. The method recited in claim 1 wherein said wafer comprises GaAs, said surface layer is formed by implanting phosphorus into said GaAs wafer to form a thin layer of GaAsP, and said dielectric is formed by thermally oxidizing a portion of said surface layer of GaAsP to form GPO (Gallium-Phosphate-Oxide).

4. The method recited in claim 1 wherein said converting step is a thermal oxidation process.

* * * * *